United States Patent [19]
Alvarez, Jr.

[11] 4,011,465
[45] Mar. 8, 1977

[54] MOSFET DETECTING AND SYNCHRONIZING CIRCUIT FOR ASYNCHRONOUS DIGITAL DATA

[75] Inventor: Cesar E. Alvarez, Jr., Griffith, Ind.

[73] Assignee: Teletype Corporation, Skokie, Ill.

[22] Filed: Sept. 2, 1975

[21] Appl. No.: 609,265

[52] U.S. Cl. .............................. 307/208; 307/218; 307/232; 307/247 R; 307/269; 307/279

[51] Int. Cl.² .................. H03K 19/08; H03K 1/17; H03K 5/13; H03K 3/26

[58] Field of Search ............... 178/69.5 R; 307/208, 307/232, 262, 269, 281, 289, 218, 247 R, 279; 328/63, 72, 195, 206

[56] References Cited

UNITED STATES PATENTS

| | | | |
|---|---|---|---|
| 3,223,930 | 12/1965 | Haile | 307/218 |
| 3,226,572 | 12/1965 | Kuroda | 307/247 R |
| 3,272,995 | 9/1966 | Alexander et al. | 307/232 |
| 3,408,581 | 10/1968 | Wakamoto et al. | 307/262 |
| 3,488,478 | 1/1970 | Gilbert | 307/208 |
| 3,935,475 | 1/1976 | Margolies | 307/208 |

OTHER PUBLICATIONS

"Low Power Gated FET Latch" by Kraft et al in IBM Tech. Discl. Bull., vol. 15, No. 7, Dec. 1972, p. 2280.

Primary Examiner—Stanley D. Miller, Jr.
Attorney, Agent, or Firm—W. K. Serp; M. Pfeffer

[57] ABSTRACT

An asynchronous data input signal is detected and synchronized by a fast-acting circuit. The input is used to modulate a local clock and a detecting latch is then driven by the data-modulated clock. Most of the propagation delay found in conventional detector-synchronizers is eliminated since the SET input to the latch, which is essentially the clock signal, is generated without any gate delay and the CLEAR input is generated with only a single gate delay. Thus, the circuit is well suited for multiple clock systems in which detection and synchronization to one clock must be accomplished before the pulse of a second clock begins.

5 Claims, 7 Drawing Figures

*Fig. 1*

PRIOR ART

PRIOR ART

MOSFET DETECTING AND SYNCHRONIZING CIRCUIT FOR ASYNCHRONOUS DIGITAL DATA

BACKGROUND OF THE INVENTION

This invention relates to apparatus for receiving digital data communications, and more particularly to circuitry which produces from an asynchronous data input a detected output synchronized to a local clock.

In digital data communications systems, the incoming signal is normally amplified and the information-containing data pulses are then detected by setting the state of a digital logic circuit, such as a latch, often in synchronization with a first local clock. In many systems, the detected reception is used to drive succeeding circuitry which is synchronized to a second clock, and the detected state of the incoming data must be established before the next clock pulse of the second clock in order for the succeeding circuitry to function properly. It is therefore necessary that the detection of the asynchronous data and its time synchronization to the first clock take place rapidly enough so that the state of the input is established without ambiguity before a pulse of the second clock.

A common mechanism used to provide both synchronization and detection involves driving a digital latch with a pair of inputs (SET and CLEAR), each derived independently from both the amplified input and the first clock. One implementation of the drivng circuitry generates a SET input when the asynchronous input pulse and the clock pulse exist simultaneously and generates a CLEAR input whenever the clock pulse is present and the asynchronous input pulse is absent. This arrangement is, however, often unsatisfactory since two inversion-gate delays are inherent in the independent generation of the SET and CLEAR inputs, and this two-gate delay may cause the detection (setting or clearing of the latch) to be completed significantly after the end of the pulse of the first clock to which it is synchronized.

This problem is most severe, of course, in multiple clock systems when the asynchronous input changes state in the middle or near the end of a synchronizing clock pulse. In these cases, the latch could start to switch as late as the trailing edge of a first clock pulse and the remainder of the switching delay would have to take place during the separation between the pulse of the first clock and the succeeding pulse of the second clock, if the system is to operate properly. Large time separation between the two clocks have been suggested, but for many systems with high operating frequencies, the maximum separation between clock pulses is not very large compared to the total gatedelay inherent in the driving circuitry. Conversely, reduction in gate delays necessitates large amounts of power consumption as well as large chip area if the circuit is fabricated as an integrated circuit using Metal Oxide Semiconductor transistors, hereafter referred to as a MOS circuit.

Accordingly, driving the latch with independently generated SET and CLEAR inputs does not provide the detection and synchronization adequate for many data communications systems. In particular, such a technique is difficult to implement in integrated circuitry suitable for operation at high frequencies.

It is therefore an object of the present invention to provide an improved detector-synchronization technique capable of receiving an asynchronous input and producing a detected output synchronized to a local clock without the abovementioned disadvantages.

It is a particular object to provide an integrated circuit for rapidly performing detection of an asynchronous input and synchronization of it to a local clock so that in two clock systems the need for large time separation between the clocks is reduced.

It is an additional object of the invention to provide the synchronization and detection using a MOS integrated circuit which is operable at high frequencies and does not dissipate excessive amounts of power.

It is a further object of the invention to provide such a circuit with capabilities of unambiguously detecting a change of state in an incoming digital pulse train during the clock pulse to which it is synchronized or shortly thereafter.

SUMMARY OF THE INVENTION

The detector-synchronizer in accordance with the present invention, is a circuit which is easily implemented using metal-oxide-semiconductor (MOS) devices. Rather than driving the detecting latch with SET and CLEAR inputs independently generated from the asynchronous signal and the clock signal, the latch is set directly by a clock signal which has been previously modulated by the asynchronous input signal, and it is cleared by the complement of the SET input. In this manner, most of the delay found in the conventional driving circuitry (not including the delay of the latch itself), is eliminated since the SET input, which is essentially the clock signal, is generated without any gate delay and the CLEAR input is generated with only a single gate delay. In addition, the power consumption and chip area is reduced because the number of inversion gates and their sizes are reduced.

In the embodiments disclosed herein negative logic is assumed and implementation with p-channel MOS circuitry is intended. Therefore pulses are assumed to be negative voltages, indicative of logical 1, and no pulses are assumed to be voltages at or near ground, indicative of logical 0.

One embodiment of the invention meets the basic objectives of setting the latch for each input pulse in conjunction with a clock pulse, but it will also clear the latch at the end of the clock pulse. The effect of this is that the latch output toggles at the clock rate, providing a pulse train output in response to a logical 1 asynchronous input, and remains constant at logical 0 in response to a logical 0 asynchronous input. A second embodiment insures that the latch will change state only upon detection of an input state change, and this change of the latch state will occur before the end of the driving clock pulse or soon thereafter. If this is not possible, the latch will not change until the next driving clock pulse. The elimination of the continuous toggling of the latch output is made possible by the addition of circuitry which grounds the latch inputs in accordance with the complement of the clock signal. This selectively decouples the inputs to the latch so that the driving circuitry actually drives the latch only during the existence of a clock pulse.

DETAILED DESCRIPTION

Figure 1:
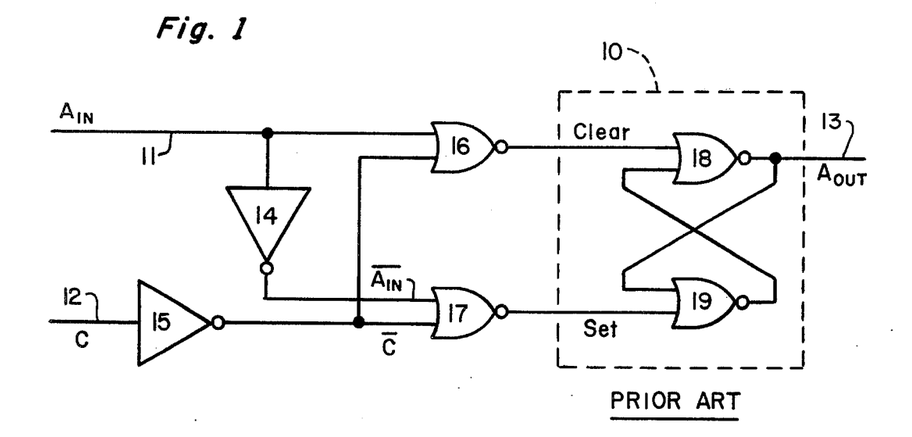
FIG. 1 is a diagram of a logic circuit of a synchronization detector in accordance with the prior art techniques.
Figure 3:
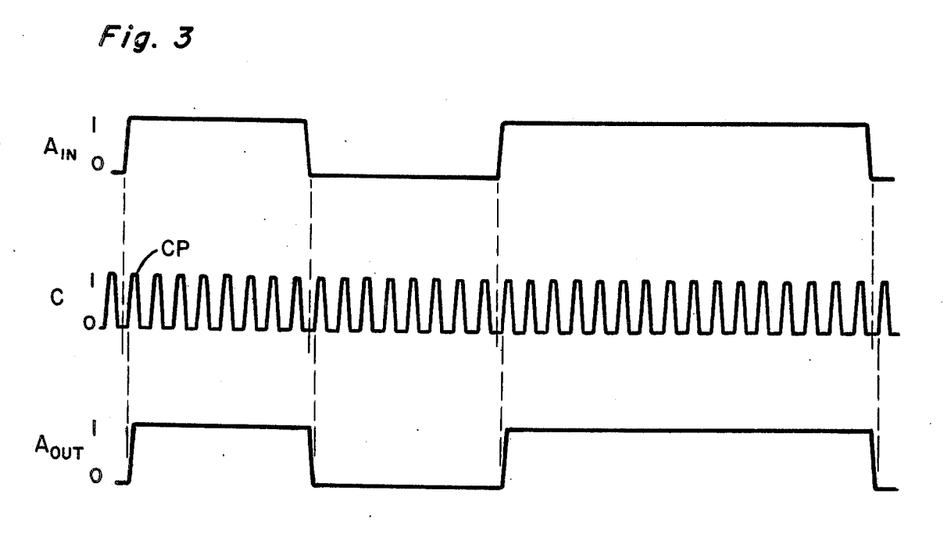
FIG. 3 is a graphic presentation of waveforms helpful in understanding the operation of the circuit of FIGS. 1 and 2.

The logic circuit of FIG. 1 illustrates the prior art technique for detecting the asynchronous input pulse train $A_{IN}$ on input lead 11 and synchronizing this input $A_{IN}$ with the clock signal C on input lead 12 to produce a synchronized output $A_{OUT}$ on output lead 13. Input $A_{IN}$ is applied to inverter 14 which produces $\overline{A_{IN}}$ and clock signal C is inverted to produce $\overline{C}$ by inverter 15. NOR-gate 16 is driven by $A_{IN}$ and $\overline{C}$ and NOR-gate 17 is driven by $\overline{A_{IN}}$ and $\overline{C}$. The outputs of gates 16 and 17 are used to drive the two inputs (SET and CLEAR) of the latch 10 which consist of two cross-coupled NOR-gates 18 and 19. As can be seen in FIG. 3, a pulse of asynchronous input $A_{IN}$ at input lead 11 causes latch 10 to toggle only when a clock pulse, such as CP, next exists.

The operation of the circuit is most easily described by first assuming that the output of inverter 15 is logical 1 (corresponding to the clock pulse being absent or OFF). Therefore, the outputs of NOR-gates 16 and 17 are logical 0. Since the two inputs to latch 10 are logical 0, then the latch remains in its previous condition, irrespective of the data on the input lead 11. When the clock pulse on lead 12 is present or ON, (logical 1), this produces logical 0 at the output of inverter 15 and this permits the $A_{IN}$ input to be sensed by latch 10 via NOR-gates 16 and 17. If $A_{IN}$ is ON (logical 1), the existance of the $A_{IN}$ pulse on lead 11 will produce logical 0 at the output of gate 16 and logical 1 at the output of gate 17. This logical 1 provides the SET input which causes latch 10 to produce logical 0 at the output of gate 19 and logical 1 at the output of gate 18, thus latching to logical 1 at output 13. When $A_{IN}$ is OFF (logical 0), the opposite is true, producing logical 0 at output 13 upon the occurrence of the next clock pulse.

Thus, latch 10 toggles with the $A_{IN}$ input in synchronism with the clock, since the latch can only change state during the presence of a clock pulse. The output $A_{OUT}$ on lead 13 is thus synchronized to the clock C, and since the clock frequency is conventionally many times greater than the frequency of the asynchronous input, the circuit operates to detect each of the input pulses.

Figure 2:
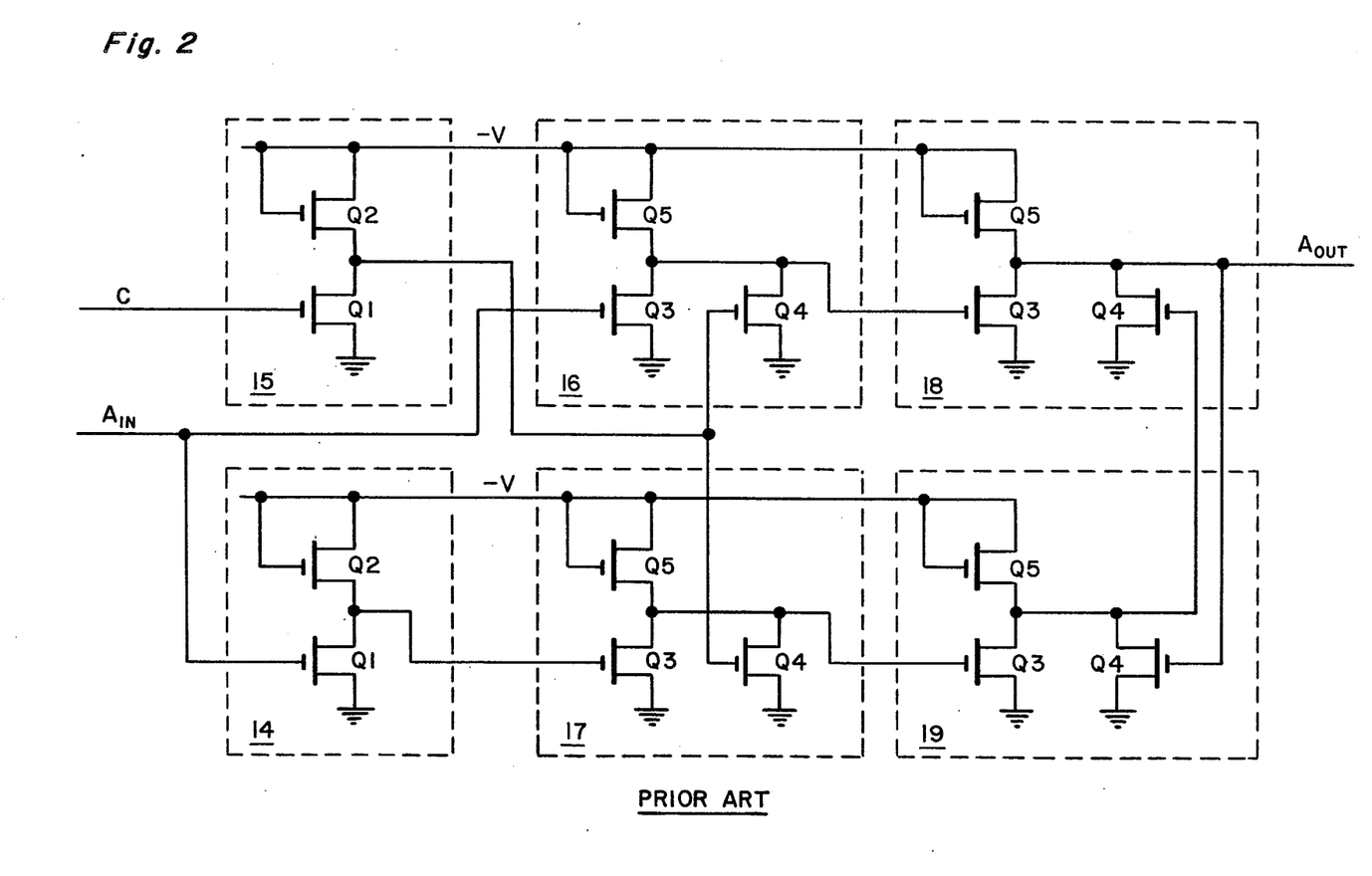
FIG. 2 is a schematic diagram of a MOS embodiment of a circuit of FIG. 1.

A schematic diagram showing a straightforward implementation of a circuit of FIG. 1 using p-channel metal-oxide-semiconductor transistors is shown in FIG. 2. Numbers indicating corresponding functional blocks are similar in both figures. Each of these MOS embodied blocks is well-known in the art. In particular, inverters 14 and 15 and NOR-gates 16–19 are conventional configurations using p-channel MOS transistors. Each inverter operates such that its output is grounded by transistor Q1 whenever a negative voltage of sufficient magnitude (logical 1) is applied to its input. When a lesser magnitude voltage (logical 0) is applied to the input of the inverter, its output goes to a voltage level which is one threshold voltage more positive than the supply voltage, $-V$, by operation of transistor Q2.

Each NOR-gate operates in a similar manner except that its output remains at ground (logical 0) as long as any of its inputs (applied to the gates of transistors Q3 and Q4) are at a negative voltage of sufficient magnitude and goes to a voltage level one threshold more positive than the supply voltage, $-V$, by operation of transistor Q5 only when all of its inputs are supplied with the lesser magnitude voltage. In both cases an intermediate negative voltage on one input will cause the gate to act as a voltage divider and output voltages anywhere between ground and one threshold more positive than the supply voltage can result.

Problems inherent in the circuit of FIG. 1 are caused by delay in the individual logic elements, such as inverters 14 and 15, NOR-gates 16 and 17, which delays affect the independently generated SET and CLEAR pulses. After arrival of the later of the input pulse or the clock pulse a minimum propagation time of two inversion-gate delays is required to produce a SET input, since inverter 14 (or inverter 15) yields one gate delay and NOR-gate 17 contributes another gate delay. Similarly, generation of the CLEAR input requires two delays after the fall of the later of the input or clock pulses. Thus, these inherent propagation delays cause the latch to switch state a finite time after the occurrence of the change of the input state.

In many systems a first clock phase controls detection, and the detection must be complete before the beginning of a clock pulse of a second clock phase which may be separated in time from the end of the clock pulse of the first clock phase. For High frequency operation this separation time is extremely small. Hence, any significant propagation delay which causes the detection to be completed during the second clock phase pulse will produce an error. Accordingly, if the input signal changes state near the end of a first phase clock pulse, the inherent two-gate delay required to generate the SET or CLEAR latch inputs will prevent the latch from completing its switch until substantially after the end of this clock pulse (after the first phase clock pulse is completely OFF), and likely during the second clock phase pulse. In addition, the latch could begin to switch and achieve an intermediate level but not complete the latch, then when the first clock phase pulse goes OFF, the latch will snap back to its original state. Such a response is obviously unacceptable for succeeding circuitry if the delay causes the snap-back to occur during the second phase clock pulse.

Figure 4:
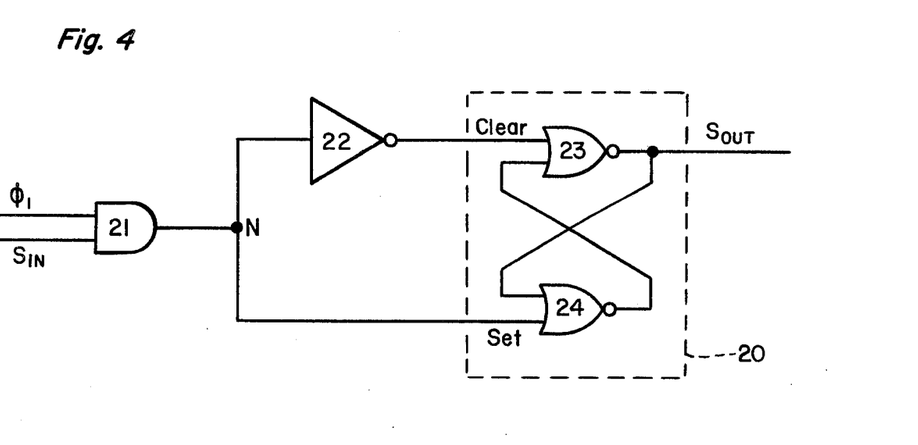
FIG. 4 is a diagram of a logic circuit of a synchronization detector in accordance with the present invention.
Figure 7:
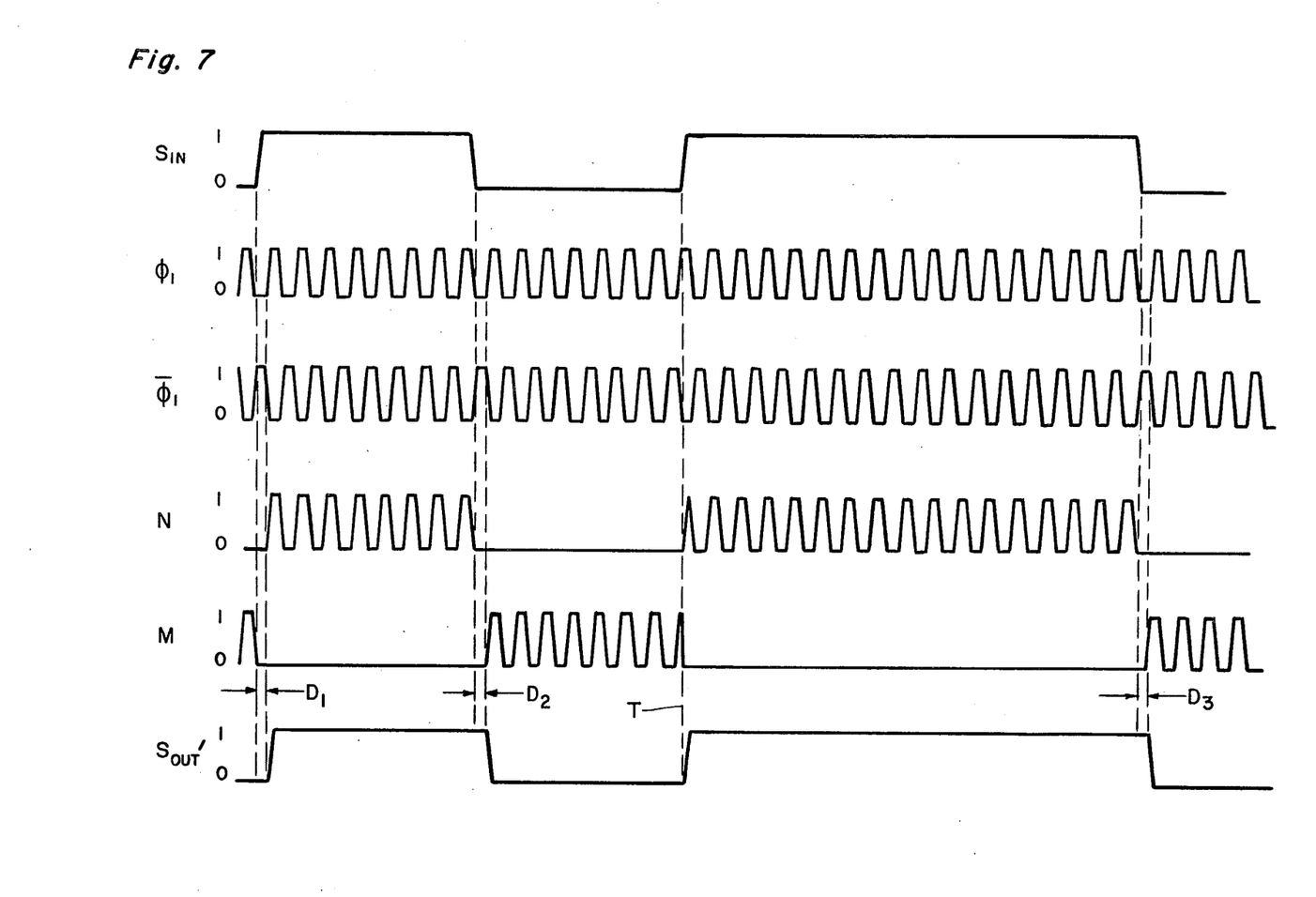
FIG. 7 is a graphic presentation of waveforms helpful in understanding the operation of the invention, especially the embodiment of FIG. 6.

In accordance with the present invention, the simpler circuit shown in FIG. 4 eliminates the two-gate delay inherent in the prior art. Instead of generating the SET and CLEAR signals independently, the driving clock signal $\phi_1$ and the asynchronous input signal $S_{IN}$ are simultaneously applied to AND-gate 21 which combines them to produce an intermediate signal at node N. This output of gate 21 duplicates the clock signal when the asynchronous input is logical 1, but provides logical 0 whenever the asynchronous input is logical 0. This is shown in FIG. 7. Hence, the signal at node N is essentially the clock signal $\phi_1$, modulated by the asynchronous input signal $S_{IN}$. This modulated clock is then applied to latch 20 directly, and indirectly via inverter 22. Accordingly, when the modulated clock at node N is logical 1 (representing the presence of a clock pulse during an input pulse) latch 20 will latch to an output, $S_{OUT}$, of logical 1. When the modulated clock signal is logical 0, indicating that the clock is OFF (no pulse) or alternatively that the $S_{IN}$ input is logical 0, the latch output will go to a logical 0 output. Accordingly, the output will toggle at the $\phi_1$ clock rate whenever the input pulse is being detected and will remain latched at logical 0 when no input pulse is being received.

This circuit suffers few of the delay problems present in the circuit of FIG. 1, since the only delay introduced prior to the latch is produced by the single inverter 22 since, as will be discussed below, the logic function of AND-gate 21 can be embodied so that no significant propogation delay is produced. The arrival of an input pulse at node N can therefore be assumed to be a "zero" time reference. The SET input will thus be produced without propogation delay and the CLEAR input will require only one gate delay. It is therefore obvious that the circuit of FIG. 4 driven by a first clock phase $\phi_1$ can detect and synchronize an input pulse before the beginning of the pulse of a closely spaced second clock phase $\phi_2$. Furthermore, with fewer logic gates required to generate the SET and CLEAR inputs than in the circuit of FIG. 1, the circuit of FIG. 4 can be embodied with fewer power consuming elements. In addition, those elements present will have greatly reduced timing constraints which will further reduce power consumption.

Figure 5:
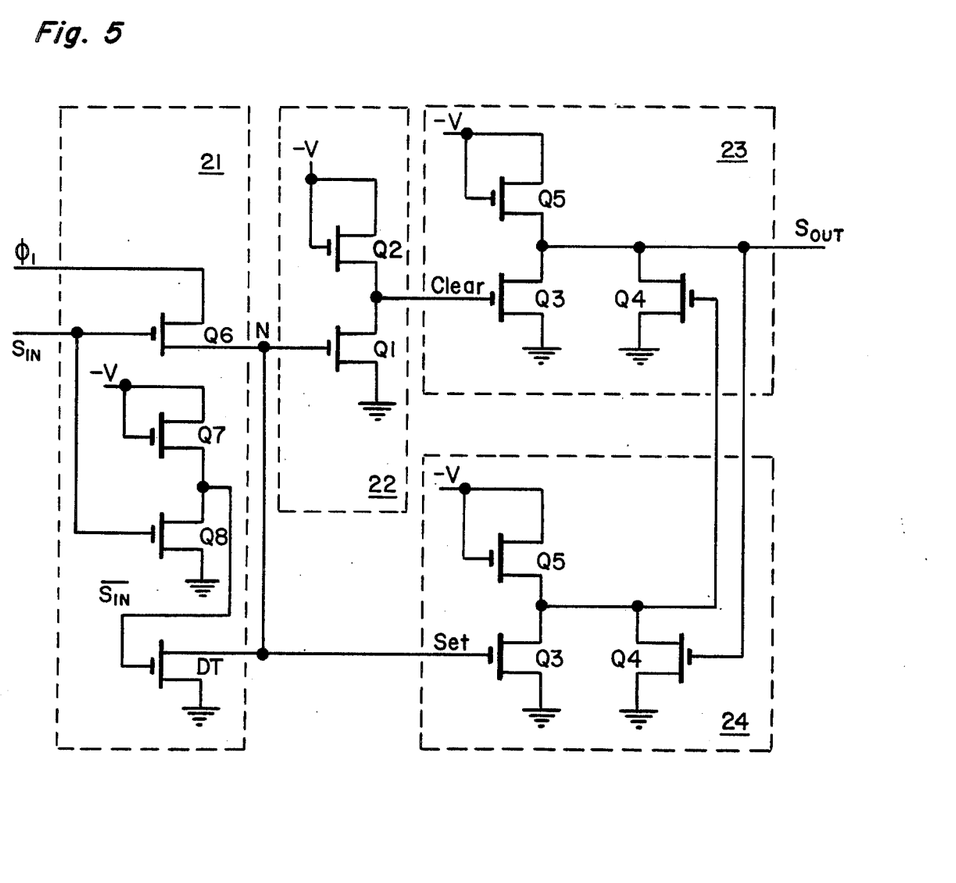
FIG. 5 is a schematic diagram of one MOS embodiment of the circuit of FIG. 4.

The circuit of FIG. 5 is a direct embodiment of the logic established by FIG. 4, using p-channel MOS transistors. Each functional block corresponds to its similarly labelled block in FIG. 4, and the inverter 22 and NOR-gates 23 and 24 operate as do inverters 14 and 15, and NOR-gates 16–19 respectively in FIG. 2. Accordingly, the MOS transistors Q1–Q5 are labelled as in FIG. 2.

AND-gate 21 is implemented by a single MOS transistor Q6 acting as a pass gate. The gate and the drain of the pass transistor act as inputs, and the source acts as the output. The clock signal $\phi_1$ is connected to the drain input while the asynchronous input $S_{IN}$ is connected to the gate input. In this manner, node N (the source of Q6) will be allowed to charge to a negative voltage only when sufficiently negative voltages (logical 1) are present simultaneously at the drain and the gate inputs. The magnitude will be the more positive of either the drain input voltage or one threshold more positive than the gate input voltage. Thus node N will go negative only when the clock signal and the asynchronous input are both representing logical 1. If the clock signal is at ground and the asynchronous input (the gate input) is at its negative level, node N will have a discharge path to ground and will immediately go to ground. This is consistent with the operation of an AND-gate. If however the clock signal is at its negative voltage and the asynchronous input goes to ground, the pass transistor will cease to conduct and the negative voltage at the output will remain until the trapped charge, which now has no path to ground, can leak off. This is not consistent with the operation of an AND-gate. To overcome this problem the dump transistor, DT, is included in the circuit. The drain of this dump transistor is connected to node N, its source is connected to ground, and its gate is connected to the complement of the asynchronous input ($\overline{S_{IN}}$) which is produced by an inverter consisting of transistors Q7 and Q8. When the asynchronous input goes to ground, its complement will go to a negative voltage causing the dump transistor to conduct providing a discharge path from node N to ground. Thus the AND-gate function is realized. The delay added by the Q7 – Q8 inverter and the dump transistor is insignificant, because the delay is entirely in the detection of the asynchronous input, $S_{IN}$, which has no fixed time relationship with the rest of the circuitry. The clock signal $\phi_1$ which does have a fixed time relationship with the rest of the circuitry is not delayed at all. Thus the affect is simply one of shifting an already asynchronous signal in time.

The continuous toggling of the output $S_{OUT}$ at the $\phi_1$ clock rate, which was discussed above with regard to FIG. 4 is, of course, a characteristic of the FIG. 5 embodiment since FIG. 5 is a direct implementation of FIG. 4. In many cases, however, it is more desirable if the output latches to a new logical state only once for each change in input state; that is, without toggling at the clock rate. The alternative embodiment of the circuit of FIG. 4 shown in FIG. 6 accomplishes this. It produces an output $S_{OUT'}$ which changes state upon an input state change, but is not toggled again until the next change of input state. The toggling is prevented by draining off, at the end of each $\phi_1$ clock pulse, the SET and CLEAR voltages which would otherwise exist at the inputs N and M to the latch.

Figure 6:
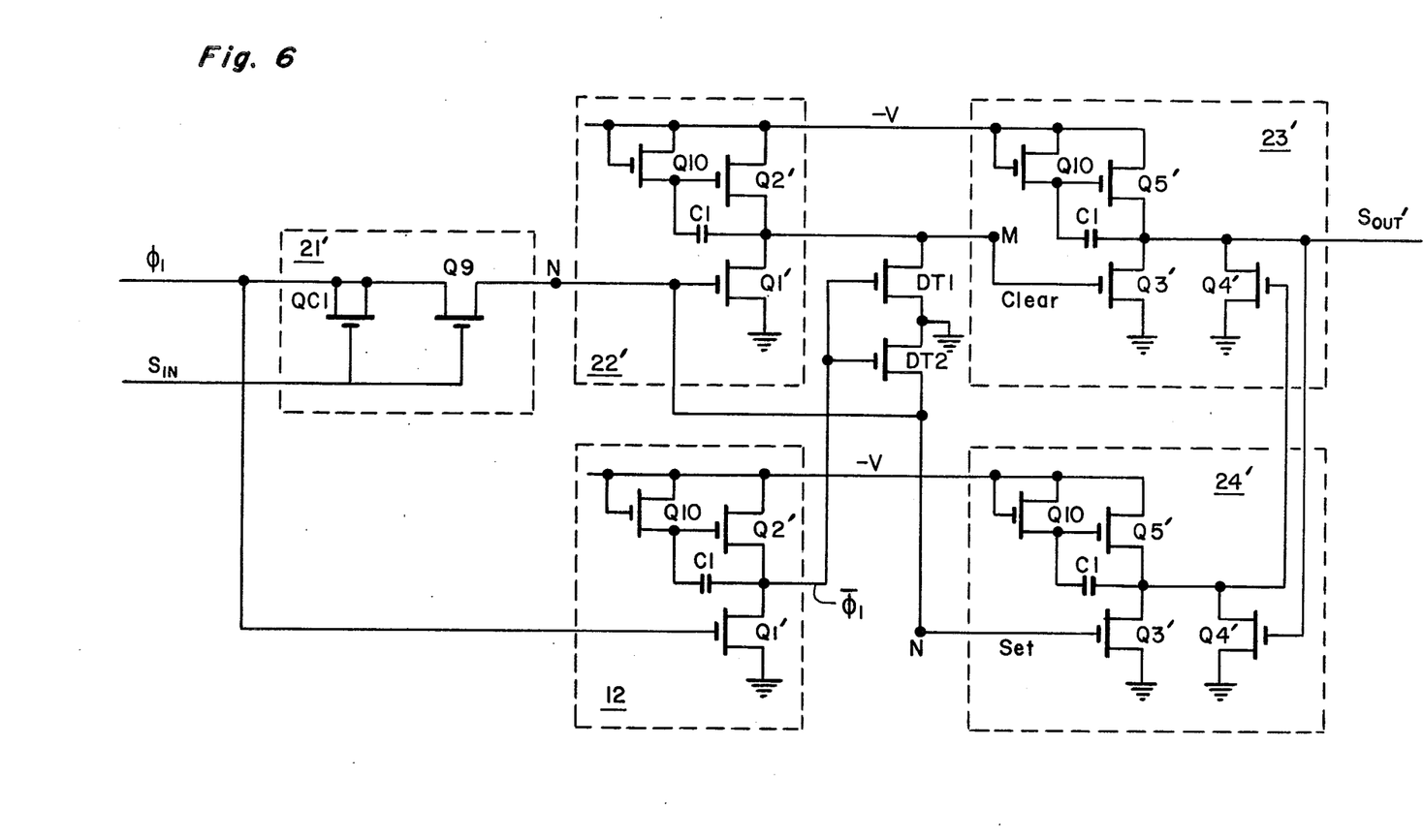
FIG. 6 is a schematic diagram of an alternative MOS embodiment of the circuit of FIG. 4.

In FIG. 6, transfer gate 21' provides the modulated clock signal at node N and operating in conjunction with dump transistors DT1 and DT2 performs the logical AND function of gate 21 in FIG. 4. Inverter 12 produces the complement $\overline{\phi_1}$ of the clock signal $\phi_1$ which is then used to drive the dump transistors DT1 and DT2. By applying the $\overline{\phi_1}$ signal to their respective gates, transistors DT1 and DT2 decouple the latch inputs, SET at node N and CLEAR at node M, from the modulated signal provided by transfer gate 21' when the $\phi_1$ clock signal goes OFF (logical 0). With this decoupling, the continuous toggling at the clock rate is prevented. Accordingly, when the clock pulse is ON, (logical 1) the latch will toggle once upon detection of an input pulse, but when that clock pulse is removed (logical 0), the input which would otherwise cause the latch to toggle back is removed by the operation of the appropriate dump transistor, which causes the node M or N to be grounded in the presence of $\overline{\phi_1}$. Thus, the latch output will go negative the first clock pulse after the asynchronous input goes negative and remain there, rather than toggle at the clock rate as in the circuit of FIG. 5, until the first clock pulse after the asynchronous input goes to ground (at which time the latch output also goes to logical 0).

This dump action will begin to take effect as soon as the clock pulse begins to fall. The operation of inverter 12 does, of course, involve some inherent delay but the decoupling, that is, the increase in voltage on the gate of dump transistors DT1 and DT2 will start to increase prior to the end of the clock pulse; in fact, it will begin increasing during the beginning of the fall of the clock pulse so that any delay introduced is small and insignificant in the overall operation, since the decoupling will be essentially complete by the end of the clock pulse. Since the decoupling is essentially complete before the clock pulse is completely OFF, for all practical purposes, no change in the input signal $S_{IN}$ occurring in the fall time of the clock pulse will be detected; but this change will be detected during the succeeding clock pulse. This may be seen in the timing diagram of FIG. 7.

The dump transistors DT1 and DT2 also provide a path to discharge their respective nodes M and N to ground. However, charge which is trapped on node N when the asynchronous input goes to ground (logical 0) while the clock is negative (logical 1) remains there until the clock goes to ground. Therefore, this circuit may not synthesize an AND-gate perfectly because the output of transfer-gate 21' can remain negative even when one of its inputs (the asynchronous input) is at ground. However if the clock signal is chosen, as it normally is, to be of a much higher frequency than the asynchronous input, the transistor DT2 discharges the node N so quickly after the return to ground of the asynchronous input that, for all practical purposes, the combination of pass-gate 21' and dump transistors DT1 and DT2 function as an AND-gate. It is noted that the AND-gate function could be provided directly, by using a circuit identical to AND-gate 21 in FIG. 5. However, transistors DT1 and DT2 would still be required and therefore using DT1 and DT2 to provide the AND-gate function is preferred since it avoides redundancy.

Thus, the circuit of FIG. 6 operates to produce a SET input at node N which corresponds to the $\phi_1$ clock in response to a logical 1 state of $S_{IN}$, and corresponds to the logical 0 of $S_{IN}$ in response to a logical 0 state of $S_{IN}$. These portions of the SET input are delayed in time from their corresponding portions of $S_{IN}$ by the time between the change of state of $S_{IN}$ and the next occurrence of a $\phi_1$ clock pulse. This phase delay time is shown, for example, as $D_1$, $D_2$, and $D_3$ in FIG. 7. The CLEAR input at node M corresponds to the $\phi_1$ clock in response to a logical 0 of $S_{IN}$ and corresponds to a logical 0 of $S_{IN}$ when $S_{IN}$ is logical 1. The corresponding portions of the CLEAR input are delayed by the phase delay time plus the one-gate propagation delay, but the propogation delay is not shown in FIG. 7 due to its relatively small size. As a result of these SET and CLEAR inputs, the latch output $S_{OUT'}$, will be set at logical 1, a phase delay time after $S_{IN}$ becomes logical 1, and will clear to logical 0 a phase delay time plus one gate delay after $S_{IN}$ becomes logical 0. The delay of the latch itself is, of course, ignored and is not shown in FIG. 7 because of its relatively small size. Thus, since at time T, $S_{IN}$ is assumed to have changed from logical 0 to logical 1 at the beginning of a $\phi_1$ pulse and hence issued the latch to have changed state without a phase delay time, this switch is shown as being instantaneous.

In FIG. 6, transfer gate 21' is shown to include a MOS transistor Q9 and in addition a MOS capacitor QC1. This latter device is basically a MOS transistor with its drain AND source shorted together. As is known, when its gate is provided with a high negative voltage (logical 1), it functions as a capacitor between its gate and shorted drain-source node. In distinction, when ground (logical 0) is applied to its gate, this capacitance between the gate and the drain-source node is very low. One purpose for this MOS capacitor is to prevent a threshold drop in transfer gate 21' since a reduction in the voltage at node N would cause the latch to switch more slowly. This is accomplished by capacitively coupling the clock voltage to the input line thus causing the input signal to go to a level substantially higher than the voltage reference level of the input $S_{IN}$, thus, compensating for the voltage drop produced by the threshold of MOS transistor Q9.

In addition, MOS capacitor QC1 serves a second function. If, for example, the asynchronous input signal $S_{IN}$ were going OFF (toward 0 volts) at precisely the same time as the clock $\phi_1$ were going ON, the possibility would exist that a voltage could be trapped at node N at some intermediate voltage level. The problems of this intermediate voltage are eliminated by the use of the MOS capacitor QC1 which boosts the gate voltage of the transistor Q9 if its gate is above the threshold voltage and causes it to pass a voltage higher than the reference voltage of the clock signal and hence produce no intermediate voltage at node N. If the input signal $S_{IN}$ is formed below threshold, the voltage at node N can get no higher (more negative) than ground, and cannot be detected.

In the implementation of FIG. 6, inverters 12 and 22' are similar to inverter 22 in FIG. 5, and NOR-gates 23' and 24', which form latch 20', are similar to gates 23 and 24 in FIG. 5. However, in addition to containing transistors Q1' – Q5' identical to corresponding transistors Q1–Q5 in FIG. 5, each of these circuits also incudes bootstrap arrangements consisting of transistors Q10 and capacitors C1 as is well-known in the art. This bootstrapping simply provides higher drive voltages and accordingly, creates faster switching times at each level throughout the circuit. Otherwise, each logical element operates as in the circuit of FIG. 5.

In all cases it is to be understood that the above described arrangements are merely illustrative of a small number of the many possible applications of the principles of the present invention. Numerous and varied other arrangements in accordance with these principles may readily be devised by those skilled in the art without departing from the spirit and scope of the invention.

What is claimed is:

1. A circuit for detecting changes of state in an asynchronous input pulse train and forming an output pulse train synchronized to a local clock, said output pulse train being representative of the detected state changes comprising:

a single pass transistor of the metal-oxide-semiconductor input having two controlled electrodes and a control electrode, the control electrode and one of the controlled electrodes serving as input electrodes and the local clock being applied to one input electrode and the asynchronous input pulse train being applied to the other input electrode, a coincident output being produced at the other controlled electrode;

latching means having two inputs for forming an output signal having alternatively a first and second state;

means for coupling the coincident output of said other controlled electrodes to each of the two inputs of the latching means; and a capacitor, said capacitor being a transistor of the metal-oxide-semiconductor type having two controlled electrodes and a control electrode, the controlled electrodes being connected in common to the one input electrode of the pass transistor and the control electrode being connected to the other input electrode of the pass transistor.

2. A circuit for detecting changes of state in an asynchronous input pulse train and forming an output pulse train synchronized to a local clock, said output pulse train being representative of the detected state changes comprising:

a single pass transistor of the metal-oxide-semiconductor input having two controlled electrodes and a control electrode, the control electrode and one of the controlled electrodes serving as input electrodes and the local clock being applied to one input electrode and the asynchronous input pulse train being applied to the other input electrode, a coincident output being produced at the other controlled electrode;

latching means having two inputs for forming an output signal having alternatively a first and second state;

means for coupling the coincident output of said other controlled electrodes to each of the two inputs of the latching means; and means for establishing a path to ground from at least one of the inputs of the latching means in response to a selected state of one of the inputs to the pass transistor notwithstanding the coincidence output from the other controlled electrode of the pass transistor.

3. A circuit as claimed in claim 2 wherein the means for establishing a path to ground includes:

a dump transistor of the metal-oxide-semiconductor type having two controlled electrodes and a control electrode, the two controlled electrodes being connected between the one input of the latching means and ground to provide a selectable path from the one input of the latching means to ground, and means for coupling the asynchronous pulse train to the control electrode of the dump transistor to establish the ground path for a selected state of the asynchronous input pulse train.

4. A circuit as claimed in claim 2 wherein the means for establishing the path to ground includes:

a pair of transistors of the metal-oxide-semiconductor type each having two controlled electrodes and one control electrode, one of the controlled electrodes of each of the pair of transistors being connected to ground, the input of each of the latching means being connected to the other controlled electrode of a different one of the pair of transistors, and means for coupling the local clock in common to both of the control electrodes of the pair of transistors so that a path to ground from both inputs of the latching means is established in response to a selected state of the local clock.

5. A circuit as claimed in claim 4 wherein the means for coupling the local clock is an inverter arranged so that the path to ground is periodically established when the local clock is in its low state, and wherein the frequency of the local clock is much greater than the frequency of the asynchronous input pulse train.

* * * * *

UNITED STATES PATENT OFFICE
CERTIFICATE OF CORRECTION

PATENT NO. : 4,011,465
DATED : March 8, 1977
INVENTOR(S) : CESAR E. ALVAREZ, JR.

It is certified that error appears in the above—identified patent and that said Letters Patent are hereby corrected as shown below:

Column 8, claim 1, line 39, change "input" to --type--;

claim 2, line 66, change "input" to --type--.

Signed and Sealed this nineteenth Day of July 1977

[SEAL]

Attest:

RUTH C. MASON
Attesting Officer

C. MARSHALL DANN
Commissioner of Patents and Trademarks